(12) United States Patent
Yamada et al.

(10) Patent No.: US 9,905,404 B2
(45) Date of Patent: Feb. 27, 2018

(54) SPUTTERING APPARATUS

(71) Applicant: CANON ANELVA CORPORATION, Kawasaki-shi, Kanagawa-ken (JP)

(72) Inventors: Satoshi Yamada, Kawasaki (JP); Ryuji Higashisaka, Kawasaki (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 186 days.

(21) Appl. No.: 14/921,883

(22) Filed: Oct. 23, 2015

(65) Prior Publication Data
US 2016/0042928 A1   Feb. 11, 2016

Related U.S. Application Data

(63) Continuation of application No. PCT/JP2014/001878, filed on Mar. 31, 2014.

(30) Foreign Application Priority Data

May 31, 2013 (JP) .................................. 2013-114834

(51) Int. Cl.
*C23C 14/00* (2006.01)
*H01J 37/34* (2006.01)
(Continued)

(52) U.S. Cl.
CPC ............ *H01J 37/347* (2013.01); *C23C 14/35* (2013.01); *C23C 14/568* (2013.01);
(Continued)

(58) Field of Classification Search
CPC .................................................. H01J 37/3411
See application file for complete search history.

(56) References Cited

U.S. PATENT DOCUMENTS

2005/0011752 A1* 1/2005 Yamazaki ......... C23C 16/45589
204/192.15
2005/0133361 A1    6/2005 Ding et al.
(Continued)

FOREIGN PATENT DOCUMENTS

JP          2000-64037 A    2/2000
JP          2007-514058 A   5/2007
WO     WO 2005/061753 A1   7/2005

OTHER PUBLICATIONS

International Search Report (PCT/ISA/210) dated Apr. 22, 2014, by the Japanese Patent Office as the International Searching Authority for International Application No. PCT/JP2014/001878.
(Continued)

*Primary Examiner* — Timon Wanga
(74) *Attorney, Agent, or Firm* — Buchanan Ingersoll & Rooney PC

(57) ABSTRACT

A sputtering apparatus includes a vacuum chamber, a substrate holder, a target support member, a cathode magnet arranged on a side of the target support member, which is opposite to a side of a substrate held by the substrate holder, a magnet moving unit configured to adjust a distance between the cathode magnet and the target support member, a target moving unit configured to adjust a distance between the target support member and the substrate, and a control unit configured to control the target moving unit and the magnet moving unit.

15 Claims, 12 Drawing Sheets

(51) Int. Cl.
*C23C 14/35* (2006.01)
*C23C 14/56* (2006.01)

(52) U.S. Cl.
CPC ...... *H01J 37/3405* (2013.01); *H01J 37/3435* (2013.01); *H01J 37/3455* (2013.01); *H01J 37/3476* (2013.01); *H01J 37/3411* (2013.01); *H01J 2237/20235* (2013.01); *H01J 2237/24564* (2013.01); *H01J 2237/24578* (2013.01); *H01J 2237/3323* (2013.01)

(56) References Cited

U.S. PATENT DOCUMENTS

2009/0114875 A1* 5/2009 Arakawa ............... C04B 35/491
                                                      252/62.9 PZ
2011/0259733 A1* 10/2011 Watanabe ............... C23C 14/35
                                                      204/192.12

OTHER PUBLICATIONS

Written Opinion (PCT/ISA/237) dated Apr. 22, 2014, by the Japanese Patent Office as the International Searching Authority for International Application No. PCT/JP2014/001878.

* cited by examiner

F I G. 6
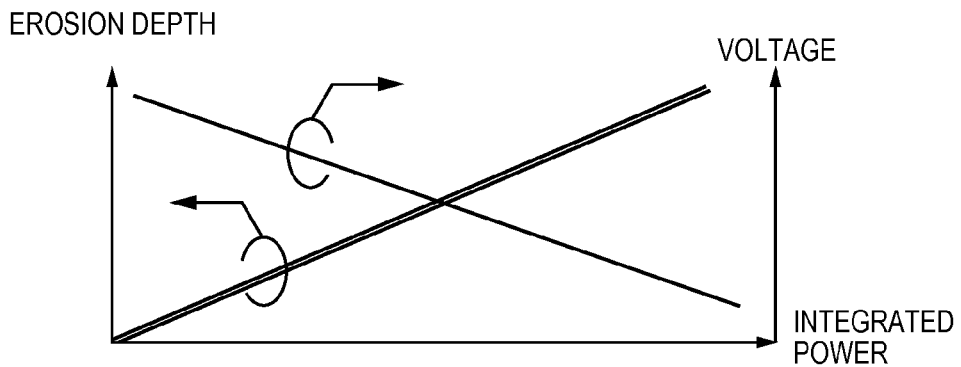
F I G. 7
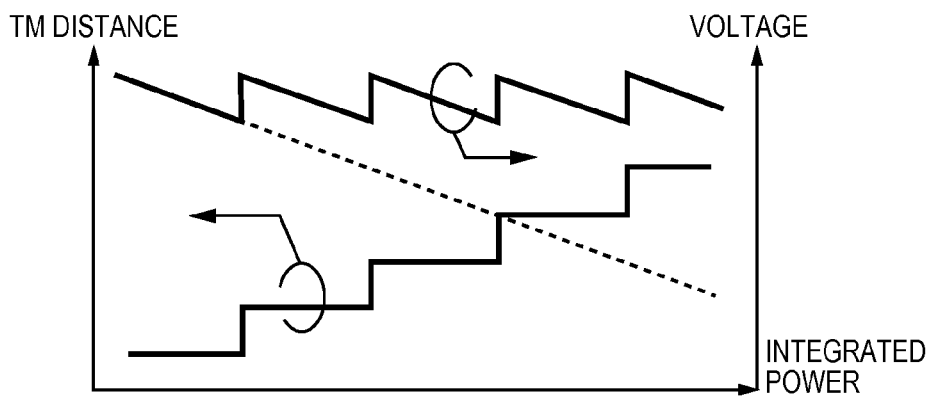
F I G. 8
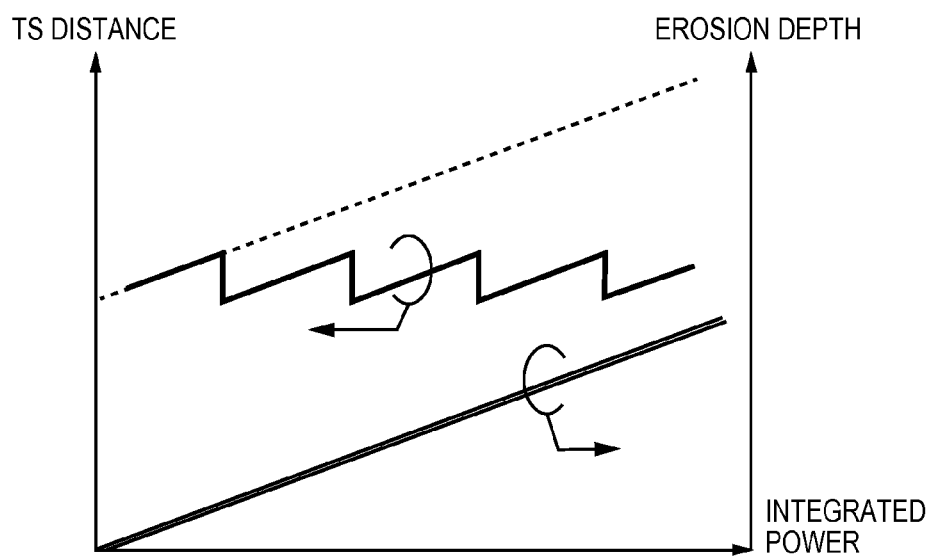

F I G. 10
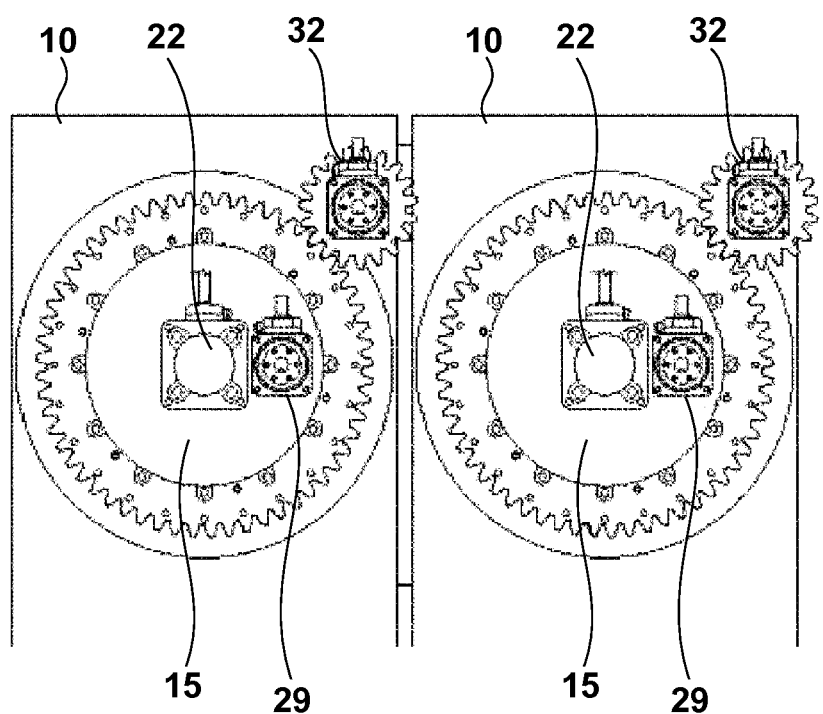

F I G. 11
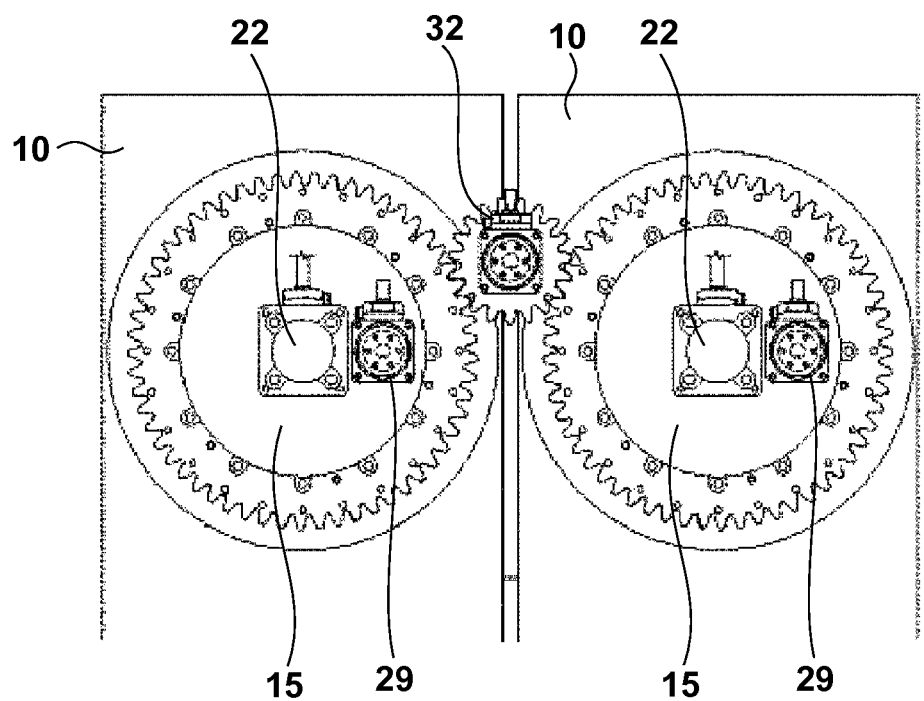

F I G. 12
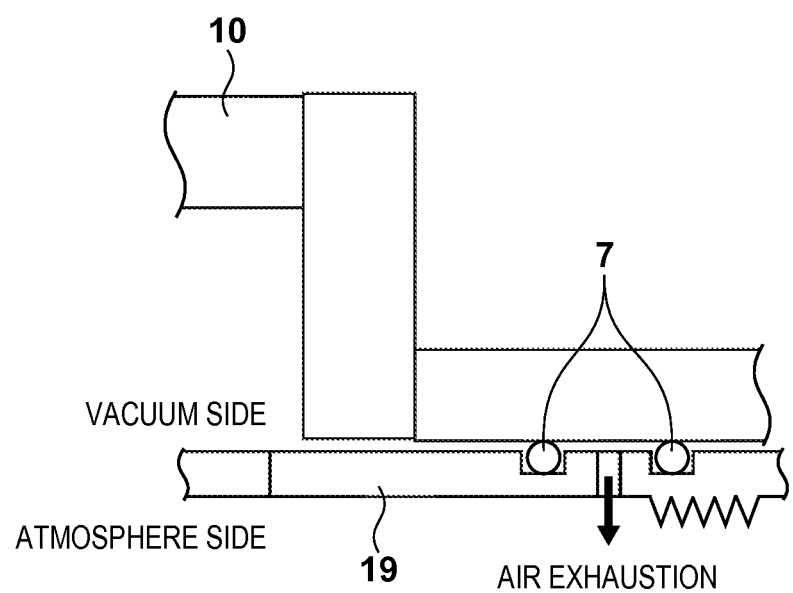

SPUTTERING APPARATUS

This application is a continuation of International Patent Application No. PCT/JP2014/001878 filed on Mar. 31, 2014, and claims priority to Japanese Patent Application No. 2013-114834 filed on May 31, 2013, the entire content of both of which is incorporated herein by reference.

TECHNICAL FIELD

The present invention relates to the field of sputtering.

BACKGROUND ART

Since the erosion of a target is made to progress by long-time sputtering deposition, the distance (to be referred to as the TS distance hereinafter) between the target and a substrate increases. There is known a deposition apparatus which can maintain an optimal film thickness distribution and deposition rate by adjusting the TS distance because the film thickness distribution and the deposition rate change with an increase in TS distance accompanying the progress of erosion (see, for example, Japanese Patent Laid-Open No. 2007-514058).

The present inventors have obtained an idea that it is not possible to sufficiently meet increasing demands for film quality such as film thickness by only adjusting the TS distance, and a useful effect can be obtained by making it possible to also adjust the distance (to be referred to as the TM distance hereinafter) between a target and a cathode magnet.

SUMMARY OF INVENTION

The present invention provides a sputtering apparatus which can adjust both a TS distance and a TM distance.

A sputtering apparatus according to the present invention comprises a vacuum chamber, a substrate holder configured to arrange a substrate at a predetermined position in the vacuum chamber, a target electrode configured to arrange a target so as to make the target face the substrate arranged by the substrate holder, a cathode magnet arranged on a side of the target electrode, which is opposite to a side of the substrate, a magnet moving unit configured to adjust a distance between the cathode magnet and the target support member, a target moving unit configured to adjust a distance between the target support member and the substrate, and a control unit configured to control the target moving unit and the magnet moving unit.

The sputtering apparatus according to the present invention can adjust both a TS distance and a TM distance, and hence can maintain an optimal film thickness distribution and deposition rate for a long period of time. This makes it possible to provide a deposition apparatus which keeps the uniformity of a deposition layer for a long period of time.

BRIEF DESCRIPTION OF DRAWINGS

FIG. 6 is a graph for explaining an example of control according to this embodiment;

FIG. 7 is a graph for explaining an example of control according to this embodiment;

FIG. 8 is a graph for explaining an example of control according to this embodiment;

FIG. 10 is a view for explaining the third embodiment of the present invention;

FIG. 11 is a view for explaining the fourth embodiment of the present invention;

FIG. 12 is an enlarged view of a portion B in FIG. 3;

DESCRIPTION OF EMBODIMENTS (First Embodiment)

Figure 1:
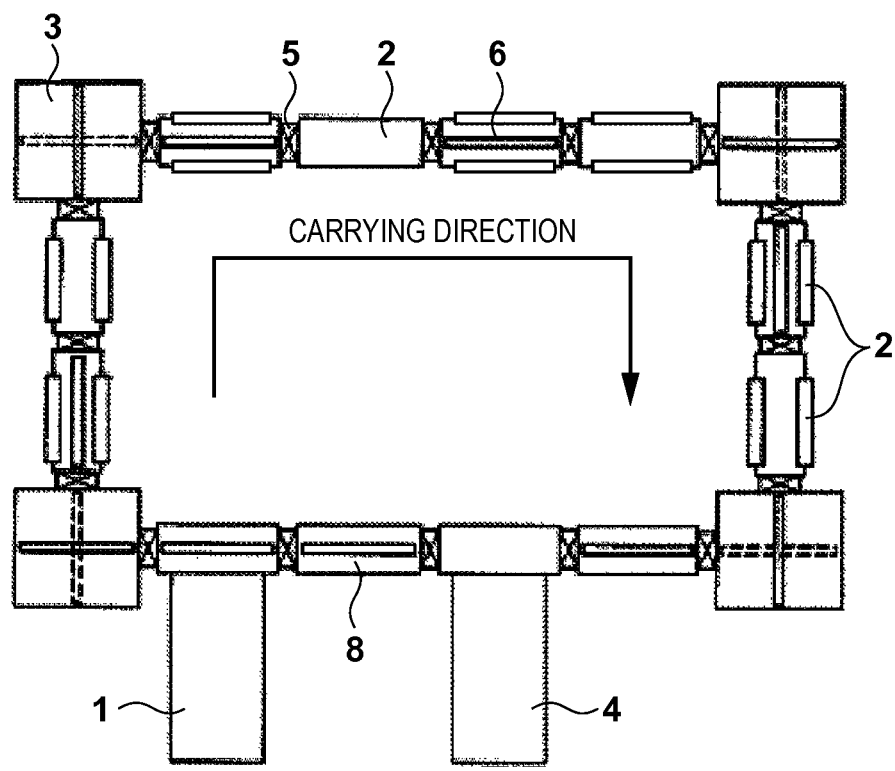
FIG. 1 is a conceptual view of a vacuum processing apparatus including a sputtering apparatus according to the first embodiment of the present invention.

FIG. 1 is a schematic view of a vacuum processing apparatus including a sputtering apparatus according to the first embodiment of the present invention. The vacuum processing apparatus in FIG. 1 is an inline type vacuum processing apparatus having a plurality of chambers capable of vacuum exhaustion which are arranged in an endless rectangular shape. A conveyance path is formed in each chamber so as to convey a substrate holder on which a substrate is mounted to an adjacent chamber. A substrate moves round inside the vacuum processing apparatus while being mounted on the substrate holder to sequentially undergo processes in the respective chambers.

A substrate is mounted on the substrate holder in the vacuum processing apparatus by a load lock chamber 1. Upon completion of a process, the substrate is unloaded from the apparatus by an unload lock chamber 4. The carrying direction of a substrate holder 6 which holds a substrate is turned through 90° in turnaround chambers 3 arranged on the four corners of the vacuum processing apparatus. That is, the carrying direction of the linearly conveyed substrate is turned through 90° to feed the substrate to a process chamber 2 for a subsequent process. The substrate holder 6 holding the substrate passes through a chamber 8 provided between the load lock chamber 1 and the unload lock chamber 4 and moves to the load lock chamber 1 again, in which a new substrate is mounted on the substrate holder 6.

Note that a plurality of process chambers capable of executing the same process may be continuously arranged to separately execute the same process a plurality of times. This makes it possible to execute even a time-consuming process without increasing the tact time. The spaces between the respective process chambers can be shut off from the adjacent process chambers by gate valves 5 attached between the chambers. This makes it possible to perform an independent process in each chamber.

Figure 2:
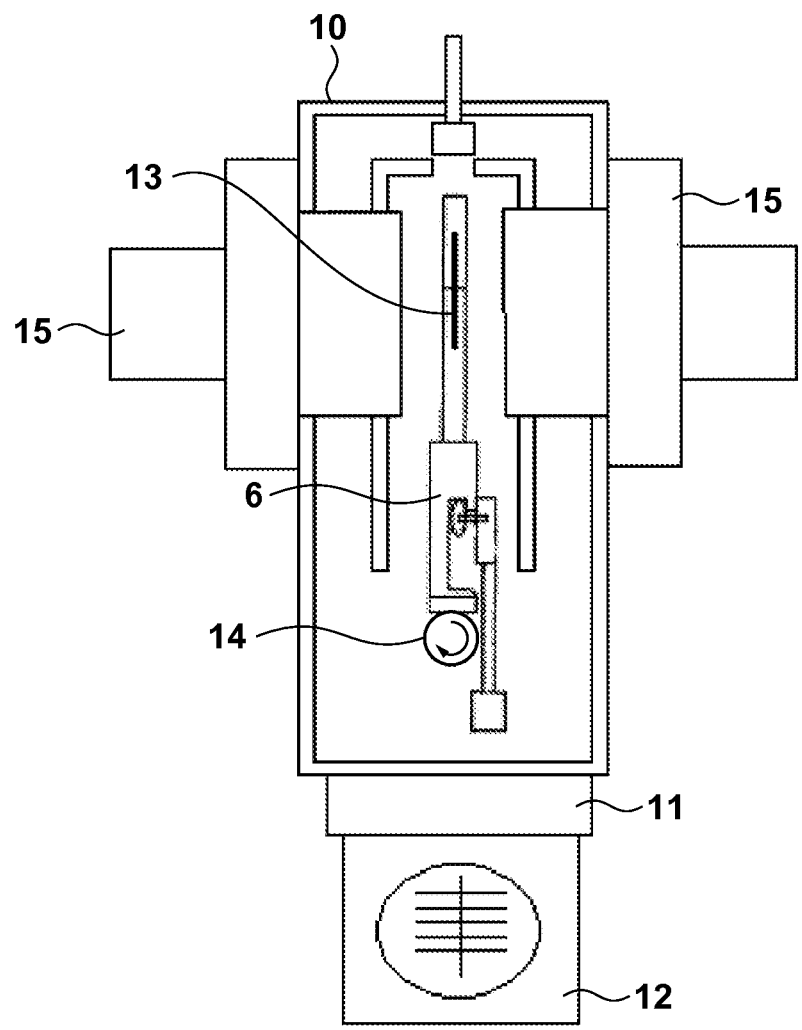
FIG. 2 is a schematic view showing the arrangement of the sputtering apparatus according to the first embodiment of the present invention.

FIG. 2 is a schematic view showing the arrangement of the sputtering apparatus incorporated in the above vacuum processing apparatus. The sputtering apparatus includes a vacuum chamber 10, an exhaust apparatus 12, a conveying apparatus 14, and target electrodes 15. A valve 11 is provided between the vacuum chamber 10 and the exhaust apparatus 12 to obviate the necessity to stop the exhaust apparatus 12 even when changing the inside of the vacuum chamber 10 to the atmosphere. The conveying apparatus 14 can move the substrate holder 6, on which a substrate 13 is mounted, between the adjacent chambers. The target electrodes 15 which perform a deposition process are arranged on the two surfaces of the substrate 13, mounted on the substrate holder 6 stopped at a predetermined position (deposition position), so as to face each other. This makes it possible to simultaneously perform a predetermined vacuum process such as deposition or annealing on the two surfaces of the substrate 13.

Figure 3:
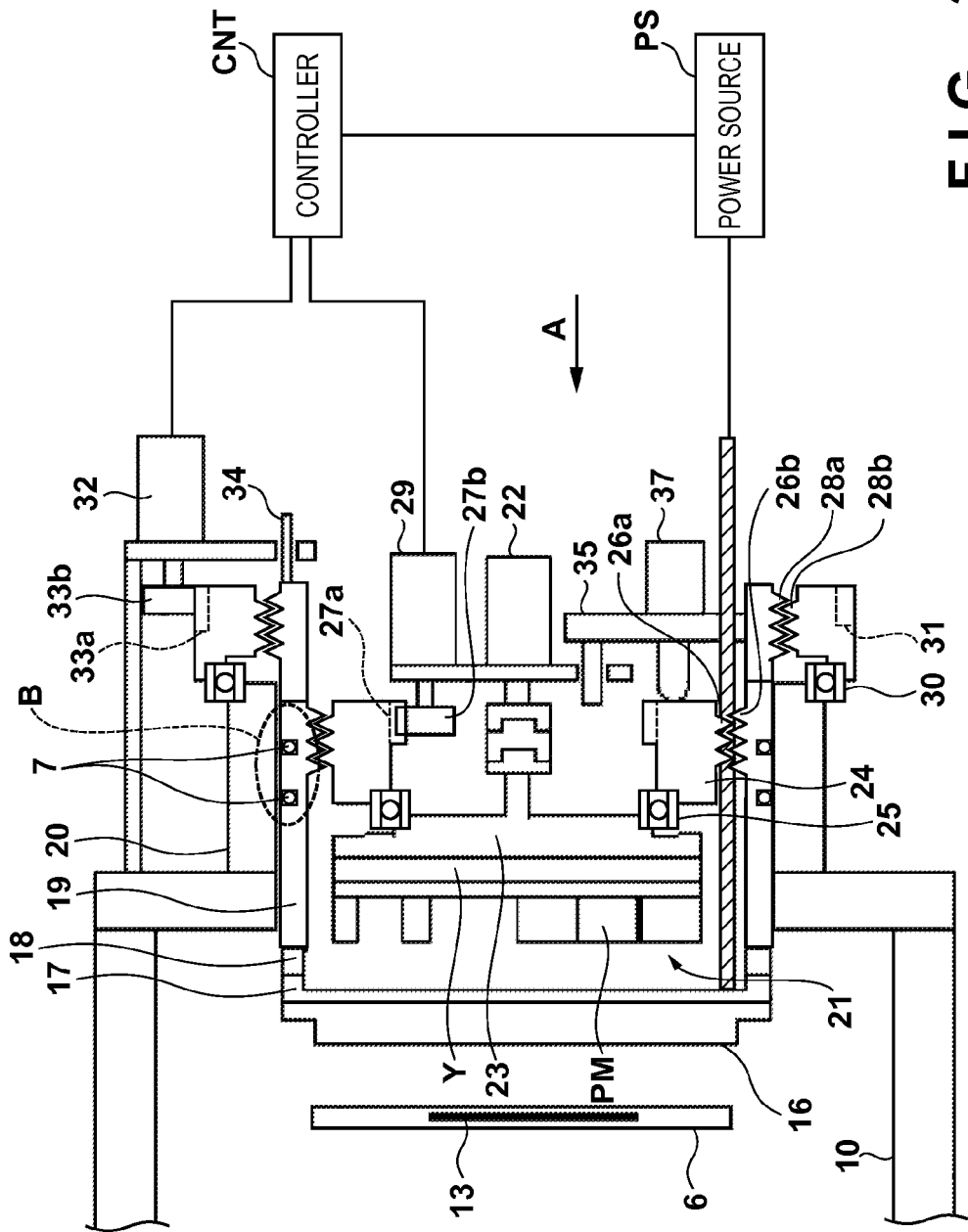
FIG. 3 is an enlarged view of a target electrode portion.

FIG. 3 is an enlarged view of the target electrodes 15 in FIG. 2 and its peripheral portion. In this embodiment, an arrangement including a cathode body 19, a target support member 17, a magnet rotating unit, a magnet moving unit, and a target moving unit will be referred to as a target electrode. A target 16 containing a material to be sputtered is attached to the target support member 17 which can support and cool the target 16. A power source applies power to the target 16 via the target support member 17. The cathode body 19 and a cathode base 20 support the target support member 17 on the vacuum chamber 10 side through an insulating stone 18. A cathode magnet 21 which generates a magnetic field (magnetic force) on the surface of the target 16 is arranged on the opposite side of the target support member 17 to the substrate 13, that is, on the rear side of the target support member 17. The cathode magnet 21 is coupled to the magnet rotating unit which rotates the cathode magnet 21 relative to the target 16 and to the magnetic moving unit which moves the cathode magnet 21 forward and backward relative to the target 16. In addition, the target electrode 15 includes a target moving unit which moves the target 16 forward and backward relative to a substrate at a predetermined position (deposition position).

The magnet rotating unit is a device which rotates the cathode magnet 21 relative to the target 16. The cathode magnet 21 includes a yoke attached to a magnet rotating member 23 (magnet support portion) and a permanent magnet PM provided on the target side of the yoke. The magnet rotating member 23 is coupled to a magnet rotating motor 22 and hence can rotate the cathode magnet 21 relative to the target 16. The magnet rotating motor 22 is fixed on the cathode body 19 side by a TM rotation stopper 35 so as not to rotate by itself.

Figure 4:
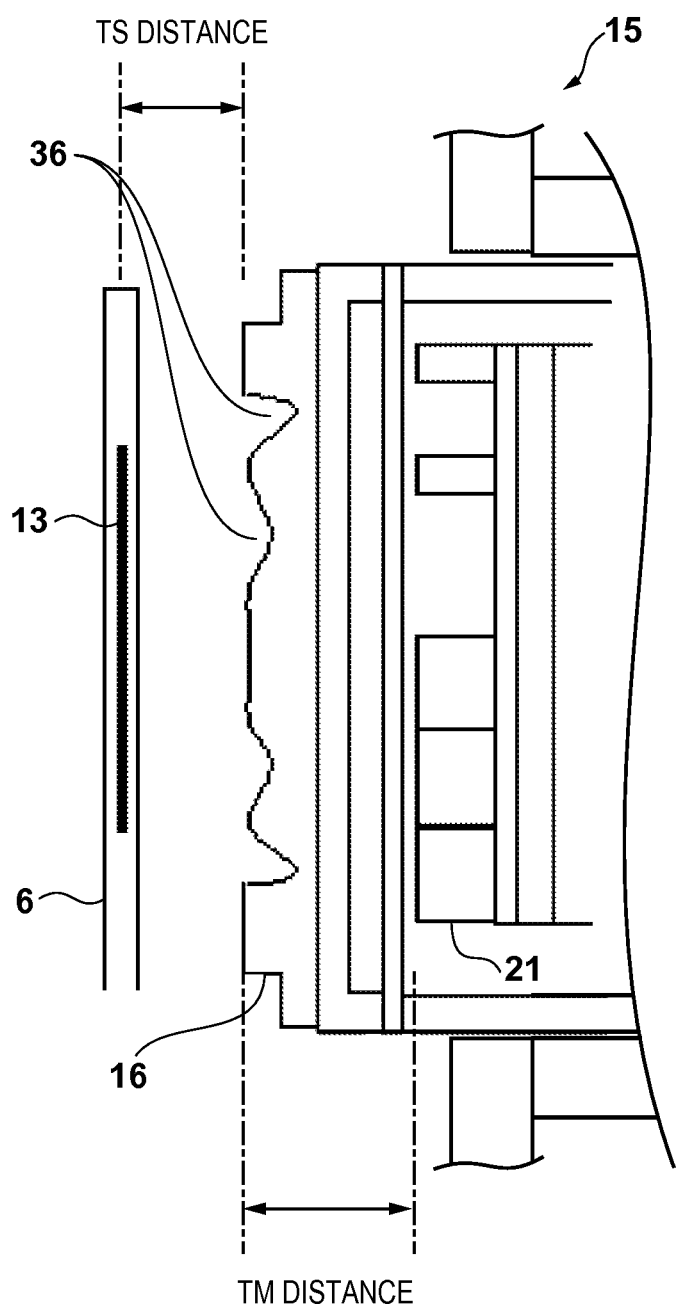
FIG. 4 is a view for explaining a TS distance and a TM distance.

The magnet moving unit is a device which moves the cathode magnet 21 forward and backward relative to the target 16. FIG. 4 is a view for explaining a TS distance and a TM distance. The interval between the target 16 and the cathode magnet 21 (magnet) is defined as the TM distance. The target support member 17 functions as a vacuum partition and can attach the target 16 at a position to face the substrate 13. The position of the cathode magnet 21 can be adjusted in a direction toward and away from the target support member 17 (target 16).

A magnet moving member 24 is attached to the cathode magnet 21 via a bearing 25. The magnet moving member 24 has a male thread 26a on its outer side. The inner side of the cathode body 19 is provided with a female thread 26b corresponding to the male thread 26a. The magnet moving member 24 is held by the cathode body 19 through the meshing between the male thread 26a and the female thread 26b. In addition, the teeth of a gear 27a are formed on the inner side of the magnet moving member 24. A gear 27b corresponding to the gear 27a is attached to the rotation axis of a TM motor 29. When the rotation axis of the TM motor 29 rotates, the magnet moving member 24 rotates and moves upon meshing between the male thread 26a and the female thread 26b. This makes it possible to change the position of the cathode magnet 24 held by the magnet moving member 24 in a direction toward and away from the target 16 attached to the cathode body 19 via the target support member 17. The TM motor 29 is fixed on the cathode body 19 side by the TM rotation stopper 35 so as not to rotate by itself. Although the same TM rotation stopper 35 is used to stop the rotation of the magnet rotating motor 22 and the rotation of the TM motor 29 in FIG. 3, individual rotation stoppers may be provided for the respective motors.

In addition, if the direction of the attractive force between the target 16 and the cathode magnet 21 shifts from the rotation axis because of the asymmetry of the in-plane distribution of the cathode magnet 21, this attractive force may serve as an offset load to cause the precession of the rotation axis of the cathode magnet 21. It is therefore possible to reduce axial runout by applying an external force to the magnet rotating member 23 using an air cylinder and a motor 37. In addition, this arrangement may be configured to receive an offset load at only male and female threads so as to suppress axial runout by improving the processing accuracy of the threads and reducing the gap between the threads to 0 without limit.

The target moving unit is a device which moves the target 16 forward and backward relative to the substrate 13 at a predetermined position (deposition position). As shown in FIG. 4, the interval between the substrate 13 and the target 16 is defined as the TS distance. The target electrode 15 can adjust the position of the target 16 in the direction toward and away from the substrate 13. A male thread 28a is formed on the outer side of the cathode body 19. A TS rotating member 31 having, on its inner side, a female thread 28b corresponding to the male thread 28a is attached to the cathode base 20 fixed to the vacuum chamber 10 via a bearing 30. Teeth 33a of a gear are formed on the outer side of the TS rotating member 31. A gear 33b corresponding to the teeth 33a is attached to the rotation axis of a TS motor 32. When the rotation axis of the TS motor 32 rotates, the TS rotating member 31 rotates. As the TS rotating member 31 rotates, the rotational motion is converted into linear motion by the male thread 28a and the female thread 28b. This can change the position of the cathode body 19 in the direction toward and away from the substrate 13. The TS motor 32 is fixed on the cathode body 19 side by a TS rotation stopper 34 so as not to rotate by itself.

According to the above embodiment, the sputtering apparatus has an axial seal structure using O-rings 7 to keep the airtightness in the vacuum chamber 10 when the cathode body 19 moves forward and backward. Doubly using the O-rings reliably prevents leakage into the vacuum chamber 10. FIG. 12 shows an example of using a structure for exhausting air between the two O-rings 7. Exhausting air between the two O-rings 7 can reliably prevent leakage from between the O-rings 7 and the vacuum chamber 10 or from between the O-rings 7 and the cathode body 19 into the vacuum chamber 10 when the O-rings 7 slide. In addition, it is possible to seal the gap between the vacuum chamber 10 and the cathode body 19 by using an expansive pipe (bellows) having a bellows structure instead of the O-rings 7.

The TM motor 29 and the TS motor 32 are connected to a controller (control unit) CNT (see FIG. 3). The controller CNT controls the TM motor 29 and the TS motor 32. The controller CNT is also connected to a power source PS which applies power to the target 16. The power source PS incorporates a monitor circuit capable of measuring the current value and voltage value applied to the target 16. Although described later, it is possible to control the TM motor 29 and the TS motor 32 in accordance with the current value and voltage value applied to the target 16. That is, the controller CNT controls the magnet moving unit and the target moving unit.

Figure 5:
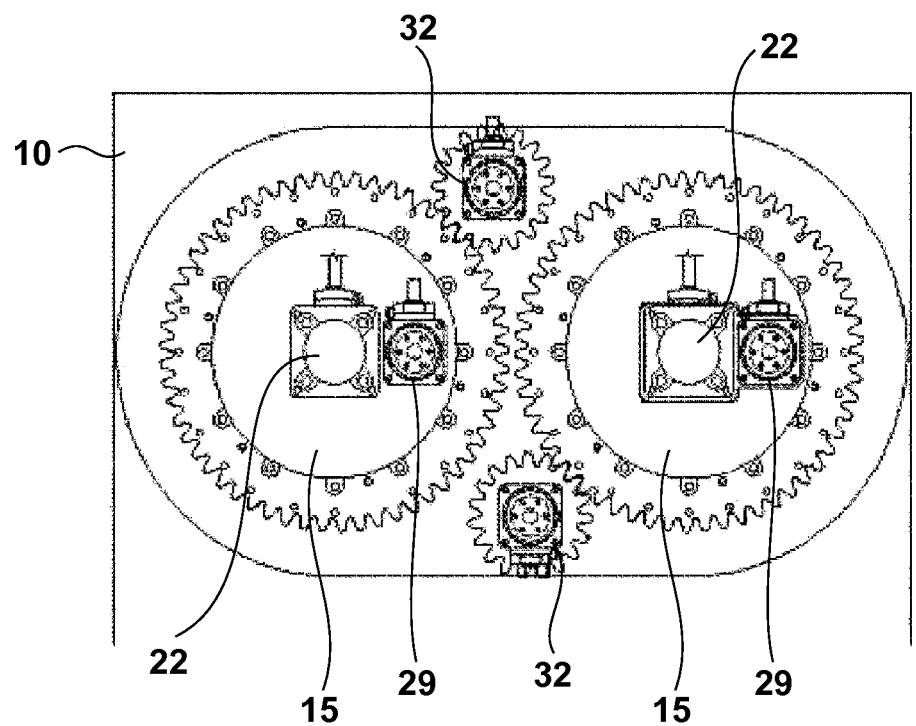
FIG. 5 is a view when target electrodes are viewed from a direction A in FIG. 3.

FIG. 5 is a view taken from the direction of an arrow A in FIG. 3, showing an example of an arrangement in which a pair of target electrodes 15 are arranged side by side in the horizontal direction to simultaneously process two substrates 13 in the single vacuum chamber 10. This arrangement includes the TM motor 29, the TS motor 32, and the magnet rotating motor 22 for each of the target electrodes 15. It is possible to change the interval between the target 16 and the position of the cathode magnet 21 and the interval between the substrate holder 6 and the position of the target 16 by using the TM motor 29 and the TS motor 32, respectively, for each target electrode 15. Note that this embodiment exemplifies an example of transmitting the torques of the TM motor 29 and the TS motor 32 to the TM rotating member and the TS rotating member by using the gears. However, it is possible to transmit the torques by using belts, chains, or wire ropes.

FIGS. 6, 7, and 8 are graphs for explaining an example of control according to this embodiment. The arrows attached to the circles surrounding lines indicate the ordinate that defines the line surrounded by the circle. As the erosion of a target progresses while the TS distance is constant, the leakage magnetic field on the surface of the target increases. The density of a plasma increases within the range in which the magnetic field has increased. A partial change in plasma density influences a film thickness distribution and a deposition rate because the change is accompanied by a change of a region to be sputtered on the target. The broken line in FIG. 7 represents a change in voltage when the TM distance is not adjusted. The broken line in FIG. 8 represents a change in TS distance when the TS distance is not adjusted.

In addition, the progress of erosion of the target itself will increase the TS distance, resulting in a change in film thickness distribution and a reduction in deposition rate. It is therefore effective for a continuous deposition process by the substrate processing apparatus to change the TS distance over time.

Figure 13:
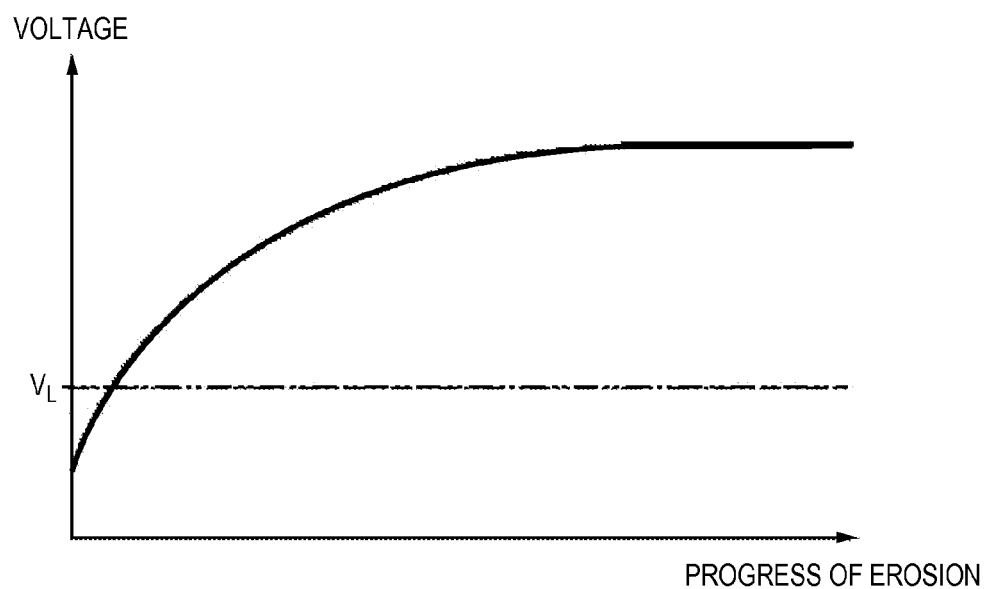
FIG. 13 is a graph showing an example of an increase in discharge voltage with the progress of erosion.

As shown in FIG. 4, as erosion 36 of the target 16 of the target electrode 15 processes, the leakage magnetic field on the surface of the target 16 increases, resulting in an increase in discharge voltage. As a result, the plasma becomes unstable and the plasma startup slows down. FIG. 13 is a graph showing an example in which the discharge voltage has increased with the progress of erosion. VL represents the maximum allowable value of the discharge voltage, beyond which the plasma becomes unstable to cause a trouble in a deposition process.

When the target 16 is a material exhibiting magnetism, in particular, it is necessary to use the cathode magnet 21 having a stronger magnetic force that can generate a leakage magnetic field on the surface of the target 16. For this reason, the amount of change in leakage magnetic field with respect to the amount of change in erosion is larger that that in the case of a nonmagnetic target. As a result, in the continuous use of the apparatus, a large temporal change in plasma shortens the maintenance intervals. As one of countermeasures against this problem, the sputtering apparatus according to this embodiment adjusts the distance (TM distance) between the cathode magnet 21 and the target 16 so as to weaken the leakage magnetic field strengthened on the surface of the target 16 with the progress of erosion.

Methods of controlling the TS distance and the TM distance and control parameters according to this embodiment will be described. As the power value (current value or voltage value) applied to the target support member 17 is changed to set the discharge voltage to VL, the power value applied to the target support member 17 changes with a change in plasma with the progress of erosion (for example, FIG. 6). For this reason, the embodiment is configured to measure a change in power value applied to the target 16, input the measurement value to the controller, and adjust the distance (TM distance) between the target 16 and the cathode magnet 21 so as to correct a change in current value or voltage value in a predetermined cycle (for example, FIG. 7). Note that the embodiment uses a discharge voltage as a power value.

Control of the TS distance will be described. This embodiment is configured to collate the integrated power measured at the time of a deposition process with data measured in advance and adjust the distance between the target 16 and the substrate 13 in a predetermined cycle (for example, FIG. 8). In the embodiment, the TS distance is adjusted to make the distance between the target 16 and the substrate 13 substantially constant. That is, the target 16 is moved forward to the substrate 13 by an amount corresponding to the amount by which the surface of the target 16 has been cut back by erosion. Note that the relationship between the integrated power applied to the target support member and the depth of erosion is measured in advance by an experiment, and the resultant data is stored in the controller in advance. Assume that the integrated power applied to the target support member 17 indicates the sum total of power applied to the target support member 17.

The TM distance and the TS distance are adjusted by controlling the rotational angles of the respective motors. Note that the monitor circuit in the power source PS can measure the current value and voltage value flowing in the target electrode 15. Simultaneously controlling the TM distance and the TS distance in this manner can correct changes in film thickness distribution and deposition rate with the progress of erosion to states before the progress of erosion. In addition, when continuously processing a plurality of substrates, it is possible to correct the TM distance and the TS distance in the continuous substrate processes without stopping the apparatus.

(Second Embodiment)

Figure 9:
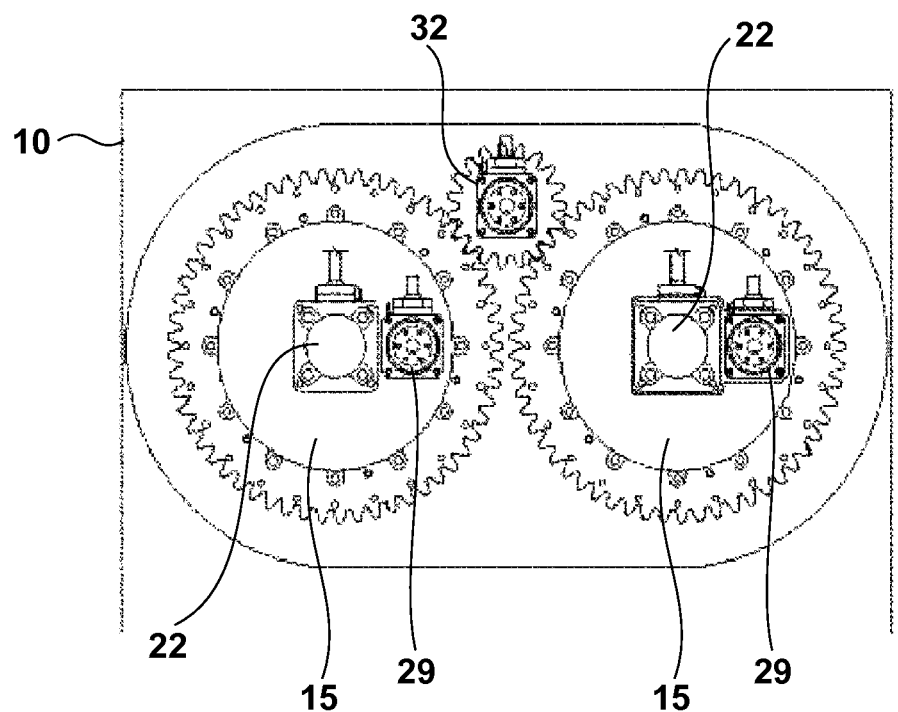
FIG. 9 is a view for explaining the second embodiment of the present invention.

FIG. 9 shows the second embodiment of the present invention. The same reference numerals denote the same constituent elements as those in the first embodiment, and a repetitive description will be omitted. The second embodiment differs in the number of TS motors from the above embodiment. More specifically, one TS motor 32 is provided for two target electrodes 15, and the TS distances from the pair of target electrodes 15 can be collectively changed.

(Third Embodiment)

FIG. 10 shows the third embodiment of the present invention. The same reference numerals denote the same constituent elements as those in the first embodiment, and a repetitive description will be omitted. The third embodiment exemplifies an apparatus which processes substrates 13 one by one in one vacuum chamber 10. One target electrode 15 which processes one surface of the substrate 13 is arranged in the single vacuum chamber 10. When the opposite surface of the substrate 13 is to be processed, the same target electrode 15 is arranged on the opposite side to the substrate 13. Since the adjacent chambers can be partitioned from each other via gate valves, different processes can be performed in the respective chambers. In addition, it is possible independently control a TS motor 32 and a TM motor 29 in accordance with the respective processes.

(Fourth Embodiment)

FIG. 11 shows the fourth embodiment of the present invention. The same reference numerals denote the same constituent elements as those in the first embodiment, and a repetitive description will be omitted. The fourth embodiment exemplifies an apparatus having the same arrangement as that in the third embodiment, including vacuum chambers and target electrodes 15 and configured to process a substrate 13. This arrangement differs from the above arrangement in that adjacent chambers share a TS motor, and can collectively change the TS distances in the adjacent chambers. Note that each embodiment described above exemplifies an example of transmitting the torques of the TM motor 29 and the TS motor 32 to the TM rotating member (a magnet moving member 24) and the TS rotating member 31 by using the gears. However, it is possible to transmit the torques by using belts, chains, or wire ropes.

(Fifth Embodiment)

Figure 14:
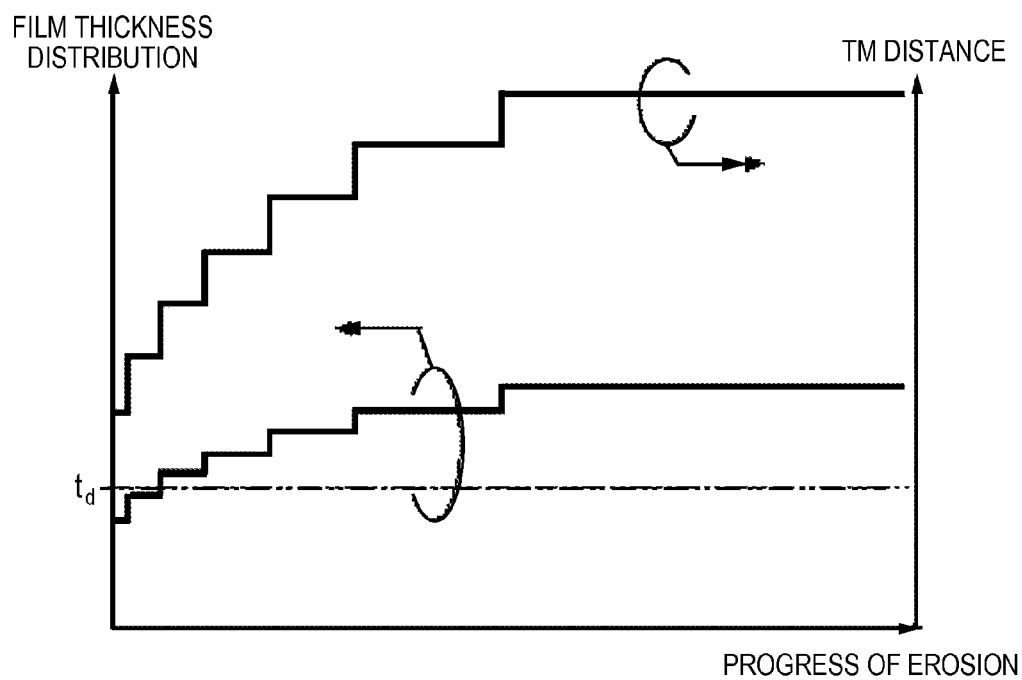
FIG. 14 is a graph showing how a film thickness distribution changes with an increase in TM distance.

This embodiment uses the same sputtering apparatus as that in the first embodiment described above, and is configured to change the method of controlling the TS distance and the TM distance. Obviously, it is possible to perform the same control as that in this embodiment by using the sputtering apparatus according to another embodiment. It is known that an increase in TM distance by the control in the above embodiments will influence the film thickness distribution on a substrate. For example, FIG. 14 is a graph showing a change in film thickness distribution with an increase in TM distance. Referring to FIG. 14, td represents the maximum allowable value of this film thickness distribution. It is obvious that the film thickness distribution can be improved by reducing the distance (TS distance) between the target and the substrate.

Figure 15:
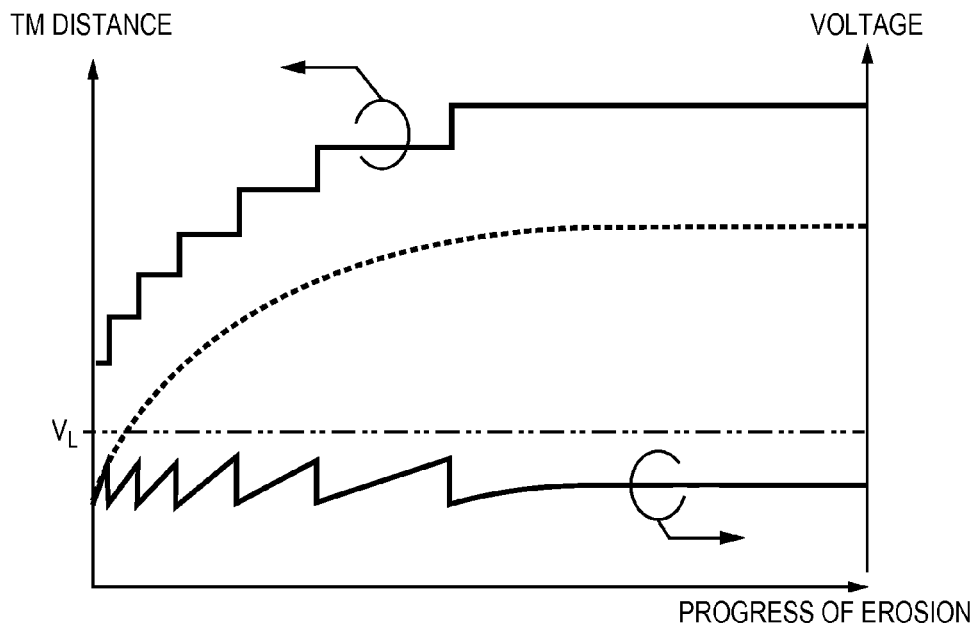
FIG. 15 is a graph showing an example of adjustment of a TM distance by a sputtering apparatus according to the fifth embodiment of the present invention.
Figure 16:
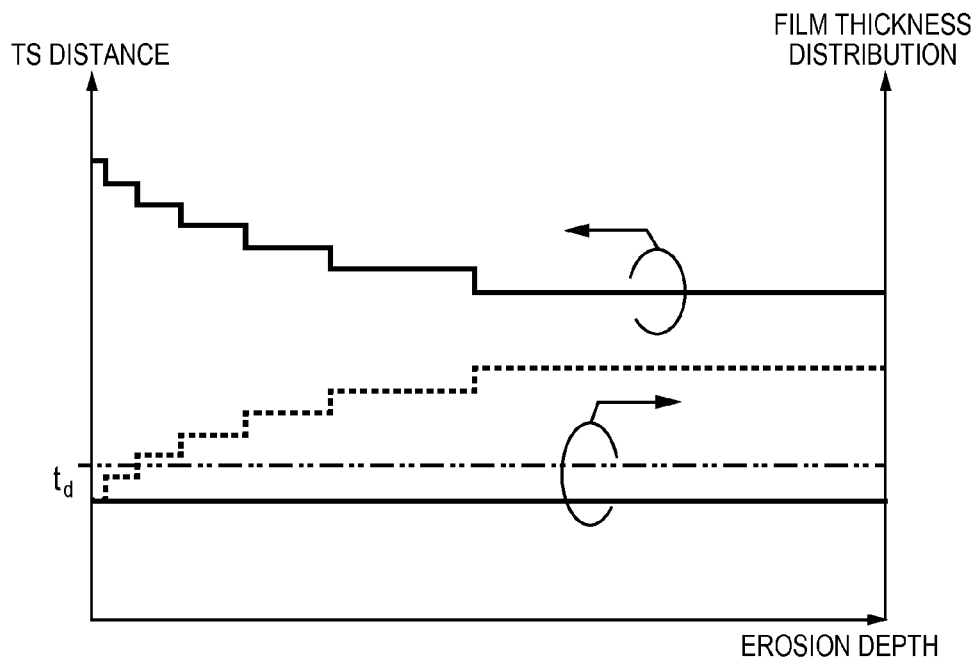
FIG. 16 is a graph showing the relationship between TM distances and film thickness distributions in the sputtering apparatus according to the fifth embodiment of the present invention.

FIG. 15 is a graph showing an example of adjustment of the TM distance by the sputtering apparatus according to this embodiment. In the embodiment, voltage values applied to a target are measured with the progress of erosion and a change in plasma, the measurement values are input to the controller, and the TM distance is adjusted in a predetermined cycle to inhibit the voltage values from exceeding VL. The TM distance is related with the TS distance by measuring the TM distance and a film thickness distribution and measuring a film thickness distribution and the TS distance in advance, and the TS distance is adjusted to inhibit the film thickness distribution on the substrate, which has changed because the TM distance has been changed, from exceeding a maximum allowable value td. FIG. 16 is a graph showing the relationship between the TM distance and a film thickness distribution in the sputtering apparatus according to the embodiment. That is, a controller CNT adjusts the distance (TS distance) between a target electrode 15 and a substrate 13 in accordance with the distance (TM distance) between a cathode magnet 21 and a target support member 17. The broken line in FIG. 15 represents a change in discharge voltage when the TM distance is not adjusted. The broken line in FIG. 16 represents a change in film thickness distribution when the TS distance is not adjusted.

That is, the TS distance is controlled in this embodiment by not only performing adjustment in accordance the amount of change in TM distance but also adjusting the TS distance based on the integrated power applied to a target so as to correct the film thickness distribution on the substrate which has changed with the progress of erosion and an increase in TS distance. In this case, the TS distance is controlled by two types of adjustments: adjustment based on the integrated power applied to a target and adjustment corresponding to the amount of change in TM distance.

In addition, when adjusting the TM distance, it is possible to adjust the TM distance from the integrated power applied to a target based on the relationship between the discharge voltages measured in advance and the integrated power applied to the target. Furthermore, the TM distance is sometimes adjusted from two factors: the discharge voltage measured in real time by a program and integrated power. Note that a monitor circuit in a power source PS can measure the discharge voltage value from the target electrode 15.

REFERENCE SIGNS LIST

1: load lock chamber, 2, 8: process chamber, 3: turn-around chamber, 4: unload lock chamber, 5: gate valve, 6: substrate holder, 7: O-ring, 10: vacuum chamber, 11: valve, 12: exhaust apparatus, 13: substrate, 14: conveying apparatus, 15: target electrode, 16: target, 17: target support member, 18: insulating stone, 19: cathode body, 20: cathode base, 21: cathode magnet (magnet), 22: magnet rotating motor, 23: magnet rotating member (magnet support member), 24: magnet moving member (TM rotating member), 25, 30: bearing, 26a, 26b: thread, 27a, 27b: gear, 28a, 28b: thread, 29: TM motor, 31: TS rotating member, 32: TS motor, 33a, 33b: gear, 34: TS rotation stopper, 35: TM rotation stopper, 36: erosion, 37: axial runout constraint air cylinder

The invention claimed is:

1. A sputtering apparatus comprising:
a vacuum chamber;
a substrate holder configured to hold a substrate in the vacuum chamber;
a target support member configured to support a target;
a cathode magnet arranged so that the target is arranged between the substrate and the cathode magnet;
a target moving unit supported by the vacuum chamber and configured to move the target support member relative to the vacuum chamber to adjust a distance between the target and the substrate; and
a magnet moving unit supported by the target moving unit and configured to move the cathode magnet relative to the target moving unit to adjust a distance between the cathode magnet and the target.

2. The sputtering apparatus according to claim 1, further comprising a controller configured to control the target moving unit and the magnet moving unit.

3. The sputtering apparatus according to claim 2, wherein the controller adjusts the distance between the cathode magnet and the target in accordance with a change in power value applied to the target support member.

4. The apparatus according to claim 2, wherein the controller adjusts the distance between the target and the substrate in accordance with integrated power applied to the target support member.

5. The sputtering apparatus according to claim 2, the controller adjusts the distance between the target and the substrate in accordance with the distance between the cathode magnet and the target.

6. The sputtering apparatus according to claim 1, further comprising a magnet rotating unit configured to rotate the cathode magnet.

7. The sputtering apparatus according to claim 1, wherein the vacuum chamber and the target support member are configured to enclose an inner space in which the substrate is processed to separate the inner space from an outer space, and wherein the apparatus further comprises a seal structure configured to allow a movement of the target support member with keeping airtightness in the inner space.

8. The sputtering apparatus according to claim 1, wherein the magnet moving unit and the cathode magnet move with the target support member when the target support member is moved by the target moving unit.

9. The sputtering apparatus according to claim 1, wherein the target support member includes a tubular member and the cathode magnet is arranged in an inner space surrounded by the tubular member.

10. The sputtering apparatus according to claim 9, wherein the tubular member of the target support member supports the magnet moving unit.

11. The sputtering apparatus according to claim 9, wherein the tubular member has a female thread, and wherein the magnet moving unit includes a member having a male thread corresponding to the female thread of the tubular member.

12. The sputtering apparatus according to claim 10, wherein the magnet moving unit further includes a motor configured to rotate the member to adjust the distance between the cathode magnet and the target.

13. The sputtering apparatus according to claim 9, wherein the target moving unit includes a ring member having a female thread, and a motor configured to rotate the ring member to adjust the distance between the target and the substrate, and wherein the tubular member of the target support member has a male thread corresponding to the female thread of the ring member of the target moving unit.

14. The sputtering apparatus according to claim 11, wherein the target moving unit includes a ring member having a female thread, a motor configured to rotate the ring member to adjust the distance between the target and the substrate, and wherein the tubular member of the target support member has a male thread corresponding to the female thread of the ring member of the target moving unit.

15. The sputtering apparatus according to claim 14, wherein the female thread and the male thread of the tubular member are arranged concentrically.

* * * * *